(12) United States Patent  
Shin

(10) Patent No.: US 7,782,276 B2
(45) Date of Patent: Aug. 24, 2010

(54) SCAN DRIVING CIRCUIT AND ORGANIC LIGHT EMITTING DISPLAY USING THE SAME

(75) Inventor: Dong Yong Shin, Seoul (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 888 days.

(21) Appl. No.: 11/506,685

(22) Filed: Aug. 18, 2006

(65) Prior Publication Data

US 2007/0079191 A1 Apr. 5, 2007

(30) Foreign Application Priority Data

Sep. 20, 2005 (KR) ...................... 10-2005-0087425

(51) Int. Cl.
*G09G 3/30* (2006.01)
(52) U.S. Cl. .................. 345/76; 345/82; 315/169.3
(58) Field of Classification Search ............. 345/76–82, 345/98; 315/169.3
See application file for complete search history.

(56) References Cited

U.S. PATENT DOCUMENTS

| 6,339,631 | B1 * | 1/2002 | Yeo et al. ...................... 377/64 |
| 6,392,628 | B1 | 5/2002 | Yamazaki et al. |
| 6,556,646 | B1 * | 4/2003 | Yeo et al. ...................... 377/54 |
| 6,760,005 | B2 * | 7/2004 | Koyama et al. ............... 345/98 |
| 7,187,356 | B2 * | 3/2007 | Koyama et al. ............... 345/98 |
| 7,456,660 | B2 * | 11/2008 | Kurokawa .................... 326/114 |
| 2004/0113873 | A1 * | 6/2004 | Shirasaki et al. .............. 345/76 |
| 2005/0259778 | A1 * | 11/2005 | Kimura ........................ 377/78 |
| 2005/0264499 | A1 * | 12/2005 | Kim et al. ..................... 345/76 |
| 2006/0007215 | A1 * | 1/2006 | Tobita et al. ................. 345/204 |
| 2006/0055632 | A1 * | 3/2006 | Ha et al. ....................... 345/46 |

FOREIGN PATENT DOCUMENTS

| CN | 1577451 A | 2/2005 |
| JP | 2000-155550 | 6/2000 |
| JP | 2003-101406 | 4/2003 |
| JP | 2004-040809 | 2/2004 |
| JP | 2004-295126 | 10/2004 |
| JP | 2004-325940 | 11/2004 |
| JP | 2004-348940 | 12/2004 |
| JP | 2005-050502 | 2/2005 |
| JP | 2005-338758 | 12/2005 |
| JP | 2006-085118 | 3/2006 |

OTHER PUBLICATIONS

Office Action issued by the Chinese Patent Office on May 16, 2008 for App. No. 200610139245.8.
Office Action dated Jan. 5, 2010 of Japanese Patent Application No. 2006-108759 corresponding to Korean Application No. 10-2005-0087425.

* cited by examiner

*Primary Examiner*—Alexander Eisen
*Assistant Examiner*—Nelson Lam
(74) *Attorney, Agent, or Firm*—Knobbe Martens Olson & Bear LLP

(57) ABSTRACT

A scan driving circuit and an organic light emitting display using the same is disclosed. A first scan driver having a plurality of first stages sequentially outputs a selection signal, and a second scan driver having a plurality of second stages sequentially outputs an emission signal. Each of the first and second stages are configured so as to have substantially zero static current, and operation speed can be optimized without significant increase in power consumption.

28 Claims, 7 Drawing Sheets

SCAN DRIVING CIRCUIT AND ORGANIC LIGHT EMITTING DISPLAY USING THE SAME

CROSS-REFERENCE TO RELATED APPLICATIONS

This application claims the benefit of Korean Patent Application No. 2005-87425, filed on Sep. 20, 2005, in the Korean Intellectual Property Office, the disclosure of which is incorporated herein by reference.

BACKGROUND OF THE INVENTION

1. Field of the Invention

The present invention relates to an organic light emitting display, and more particular to a light emitting display and a driving method and circuit thereof, which may reduce the number of output lines in a data driver.

2. Description of the Related Technology

In general, an organic light emitting display electrically excites an organic compound such that it emits light. Circuits use voltage or current to drive an array of organic emitting cells so as to display images. Such an organic emitting cell often includes an anode formed of indium tin oxide (ITO), an organic thin film, and a cathode layer formed of metal.

The organic thin film has a multi-layer structure including an emitting layer (EML), an electron transport layer (ETL), and a hole transport layer (HTL) so as to maintain balance between electrons and holes and improve emitting efficiencies. The organic thin film may further include an electron injection layer (EIL) and a hole injecting layer (HIL).

Methods for driving organic emitting cells include a passive matrix method, and an active matrix method using thin film transistors (TFTs) or metal oxide semiconductor field effect transistors (MOSFETs). The passive matrix has cathode lines and anode lines crossing with each other, and selectively drives a cathode line and an anode line. The active matrix connects a TFT and a capacitor with each ITO pixel electrode to store a voltage according to the capacitor. The active matrix method is classified as either a voltage programming method or a current programming method according to signals supplied for storing the voltage at the capacitor.

The active matrix type of organic light emitting display includes a display panel, a data driving circuit, a scan driving circuit, and a timing controller. The scan driving circuit receives a scan drive control signal from the timing controller, generates a scan signal, and sequentially provides the scan signal to scan lines of the display panel.

That is, the scan driving circuit functions to sequentially generate the scan signal to be provided to the display panel in order to drive pixels included in the display panel.

FIG. 1 is a block diagram showing a conventional scan driving circuit. With reference to FIG. 1, the conventional scan driving circuit includes a plurality of stages ST1 to STn, which are connected to a start pulse SP input line. The plurality of stages ST1 to STn sequentially shifts a clock pulse in response to a start clock SP so as to generate output signals SO1 to Son. In this case, each of second to n-th stages ST2 to STn receives and shifts an output signal of a previous stage as a start pulse.

Accordingly, the stages generate output signals SO1 to SOn in such a way that the start pulse is sequentially shifted, and provide the output signals to a matrix pixel array.

FIG. 2 is a circuit diagram of a stage in the scan driving circuit shown in FIG. 1. FIG. 3 is an input/output waveform diagram of the stage shown in FIG. 2. Referring to FIG. 2 and FIG. 3, each stage uses a master-slave flip-flop. When a clock clk is at low level, such a flip-flop continues to receive an input and maintains a previous output.

In contrast, when the clock clk has a high logic level, the flip-flop maintains an input IN received when the clock clk is at the low level, and outputs the received signal even if the input IN changes.

In the aforementioned circuit, an inverter included in the flip-flop, shown in FIG. 2, has a problem in that a static current flows when an input thereof is at low level. Furthermore, in the flip-flop, the number of inverters having received a high-level input is the same number as that of inverters having received a low-level input. Accordingly, the static current constantly flows through half of the inverters in the flip-flop, thereby causing excessive power consumption.

In addition, FIG. 2 shows an embodiment of the inverter circuit. According to this embodiment the high level output of the inverter is determined according to the ratio of resistance values of first and second PMOS transistors M1 and M2. The low level output of the inverter is determined according to the threshold voltage of the first PMOS transistor M1.

Due to manufacturing variations, resistance and threshold parameters vary significantly from transistor to transistor. This is a significant problem because the transistors for organic light emitting displays often use transistors having high manufacturing variability. As a result, the performance of the circuit of FIG. 2 is uncertain. For example, threshold variation causes the low level output of each inverter to vary. As a result, when a low level output from a first inverter having an uncertain value is provided as the input to a second inverter, the second inverter may have a degraded high output level because the uncertain low value results in uncertain pull-up resistance in the first PMOS transistor of the second inverter.

Furthermore, in the inverter, when outputting a high level, a constant electric current flows through both the first and second PMOS transistors M1 and M2. This results in constant power consumption. Also, the constant electric current flowing in the second PMOS transistor M2 causes slower rise times for the inverter output signal.

SUMMARY OF CERTAIN INVENTIVE ASPECTS

Accordingly, it is an aspect of the present invention to provide a scan driving circuit and an organic light emitting display using the same, which reduce power consumption by removing a current flow path of a static current from the scan driving circuit in an active matrix type current programming organic light emitting display, wherein the scan driving circuit includes a first scan driver for providing a selection signal and a second scan driver for providing an emission signal.

One embodiment is a scan driving circuit including a first scan driver including a plurality of first stages and configured to sequentially output a selection signal, and a second scan driver including a plurality of second stages and configured to sequentially output an emission signal. Each of the first and second stages includes a first transistor configured to receive an output voltage of a previous stage or a first input signal, and including a gate terminal coupled to a first clock terminal and an output terminal, a second transistor coupled with a second clock terminal and an output line, and including a gate terminal coupled to the output terminal of the first transistor, a third transistor coupled between a second power supply and a first node, including a gate terminal coupled to the first clock terminal, a fourth transistor coupled with the first clock terminal and the first node, and including a gate terminal coupled to the output terminal of the first transistor, and a fifth transistor coupled between a first power supply and the output line, and including a gate terminal coupled to the first node.

Another embodiment is a scan driving circuit including first and second clock signal input lines configured to, respectively, receive first and second clock signals, a first scan driver configured to output a selection signal, the first scan driver including a plurality of first stages, a second scan driver configured to output an emission signal, the second scan driver including a plurality of second stages, where each of the first and second stages includes an input terminal and first and second clock terminals, and is coupled to an input line at the input terminal or an output line of a previous stage so as to receive an input signal at the input terminal, and is coupled to the first and second clock signal input lines so as to receive the first and second clock signals at the first and second clock terminals. Each stage is configured to perform a precharge operation outputting a high-level signal and receiving the input signal, where the precharge operation is performed during a first portion of a period of at least one of the first clock signal and the second clock signal, and to output a level corresponding to the level of the input signal, where the plurality of first stages are collectively configured to sequentially generate a series of low level pulses, and where the low level pulses are generated substantially once every half period of at least one of the first and second clock signals.

Another embodiment is an organic light emitting display including a pixel array coupled to selection signal lines, data lines, and light emitting signal lines, a data driving circuit configured to supply a data signal to the data lines, and a scan driving circuit. The scan driving circuit includes first and second clock signal input lines configured to receive first and second clock signals, a first scan driver configured to output a selection signal. The first scan driver includes a plurality of first stages, a second scan driver configured to output an emission signal, the second scan driver including a plurality of second stages, where each of the first and second stages includes an input terminal and first and second clock terminals, and is coupled to an input line at the input terminal or an output line of a previous stage so as to receive an input signal at the input terminal, and is coupled to the first and second clock signal input lines so as to receive the first and second clock signals at the first and second clock terminals. Each stage is configured to perform a precharge operation outputting a high-level signal and receiving the input signal, where the precharge operation is performed during a first portion of a period of at least one of the first clock signal and the second clock signal, and to output a level having a level corresponding to the input signal, where the plurality of first stages are collectively configured to sequentially generate a series of low level pulses, where the low level pulses are generated substantially once every half period of at least one of the first and second clock signals.

BRIEF DESCRIPTION OF THE DRAWINGS

These and/or other aspects and advantages will become apparent and more readily appreciated from the following description of embodiments, taken in conjunction with the accompanying drawings of which.

DETAILED DESCRIPTION OF CERTAIN INVENTIVE EMBODIMENTS

Figure 1:
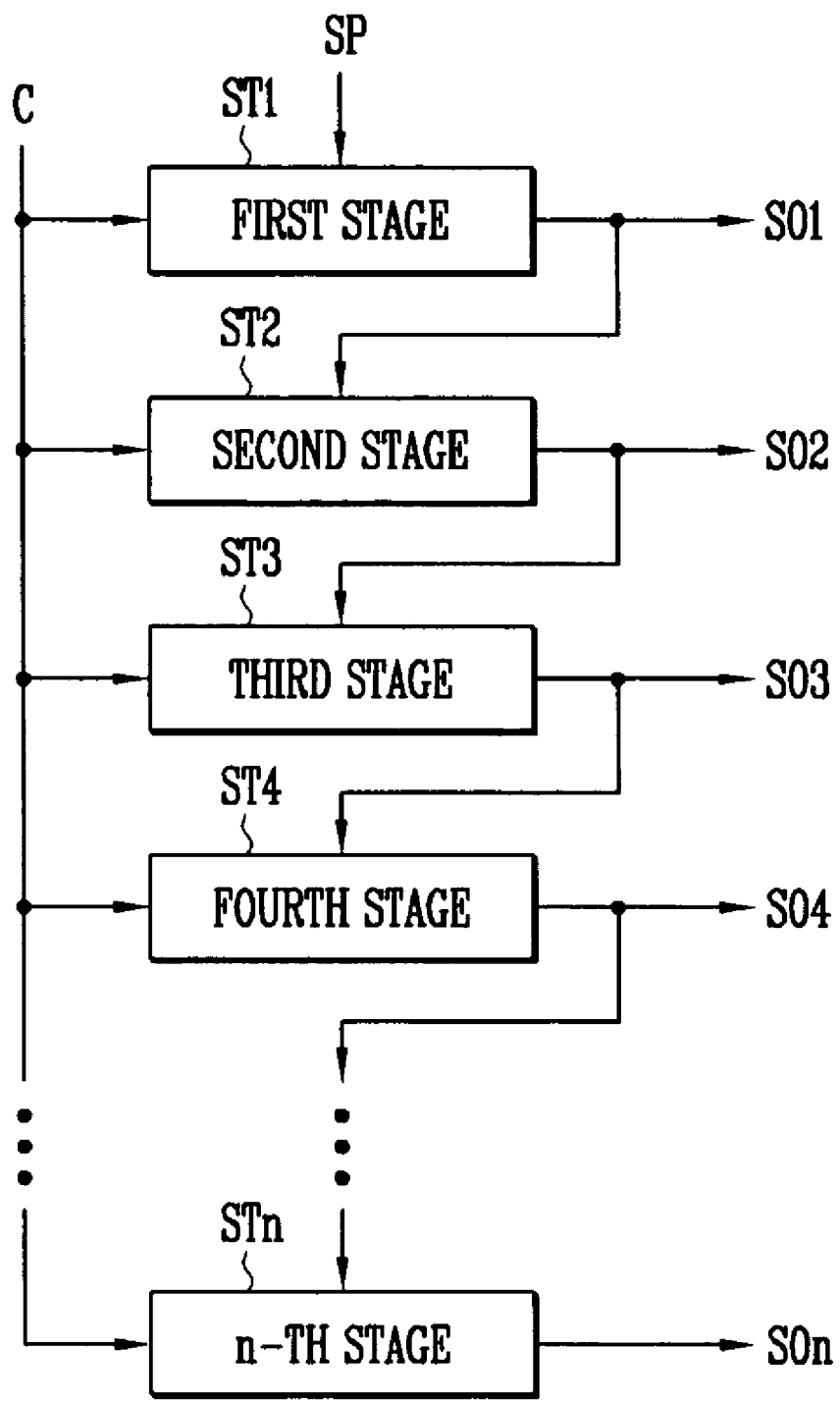
FIG. 1 is a block diagram showing a conventional scan driving circuit.
Figure 2:
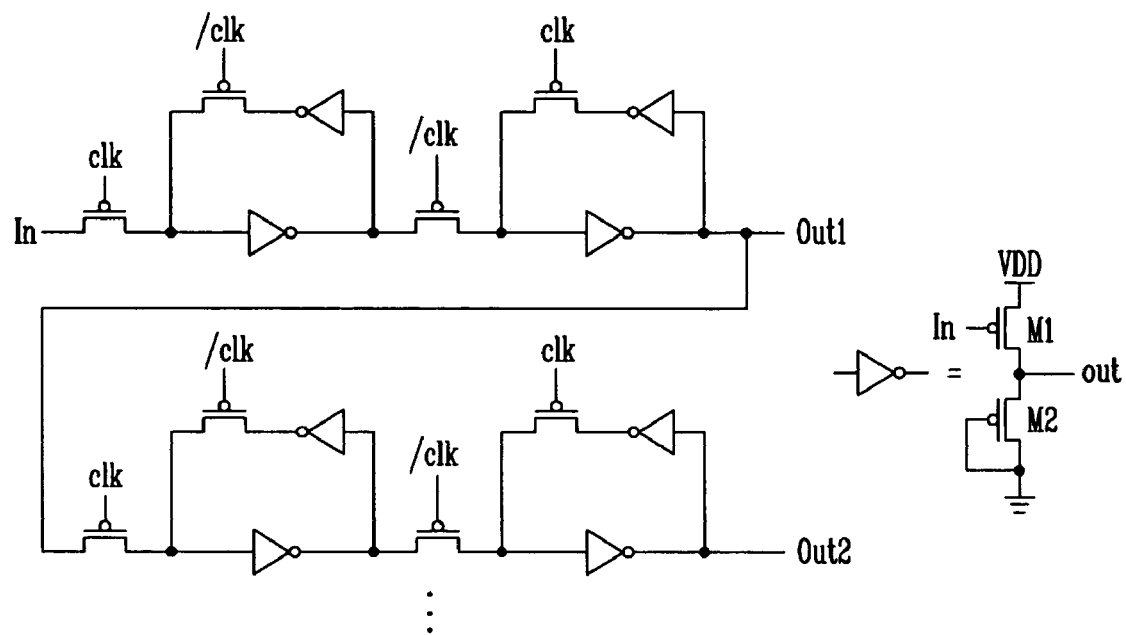
FIG. 2 is a circuit diagram of a stage in the scan driving circuit shown in FIG. 1.
Figure 3:
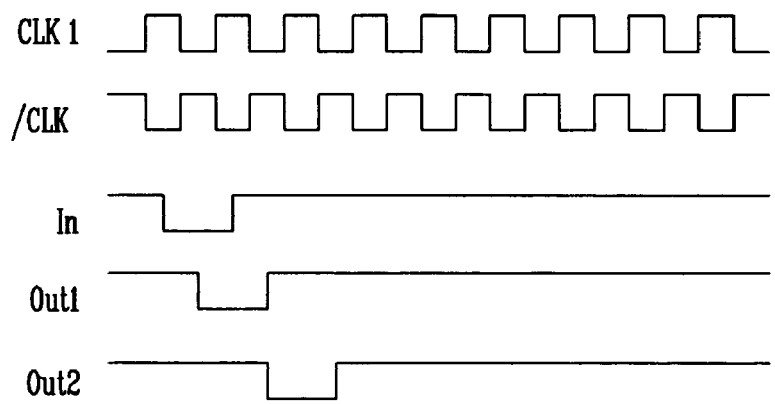
FIG. 3 is an input/output waveform diagram of the stage shown in FIG. 2.

Hereinafter, certain inventive embodiments will be described with reference to the accompanying drawings. Here, when a first element is connected to a second element, the first element may be directly connected to the second element or may be indirectly connected to the second element via a third element. Further, non-relevant, elements are omitted for clarity. Also, like reference numerals refer to like elements throughout.

Figure 4:
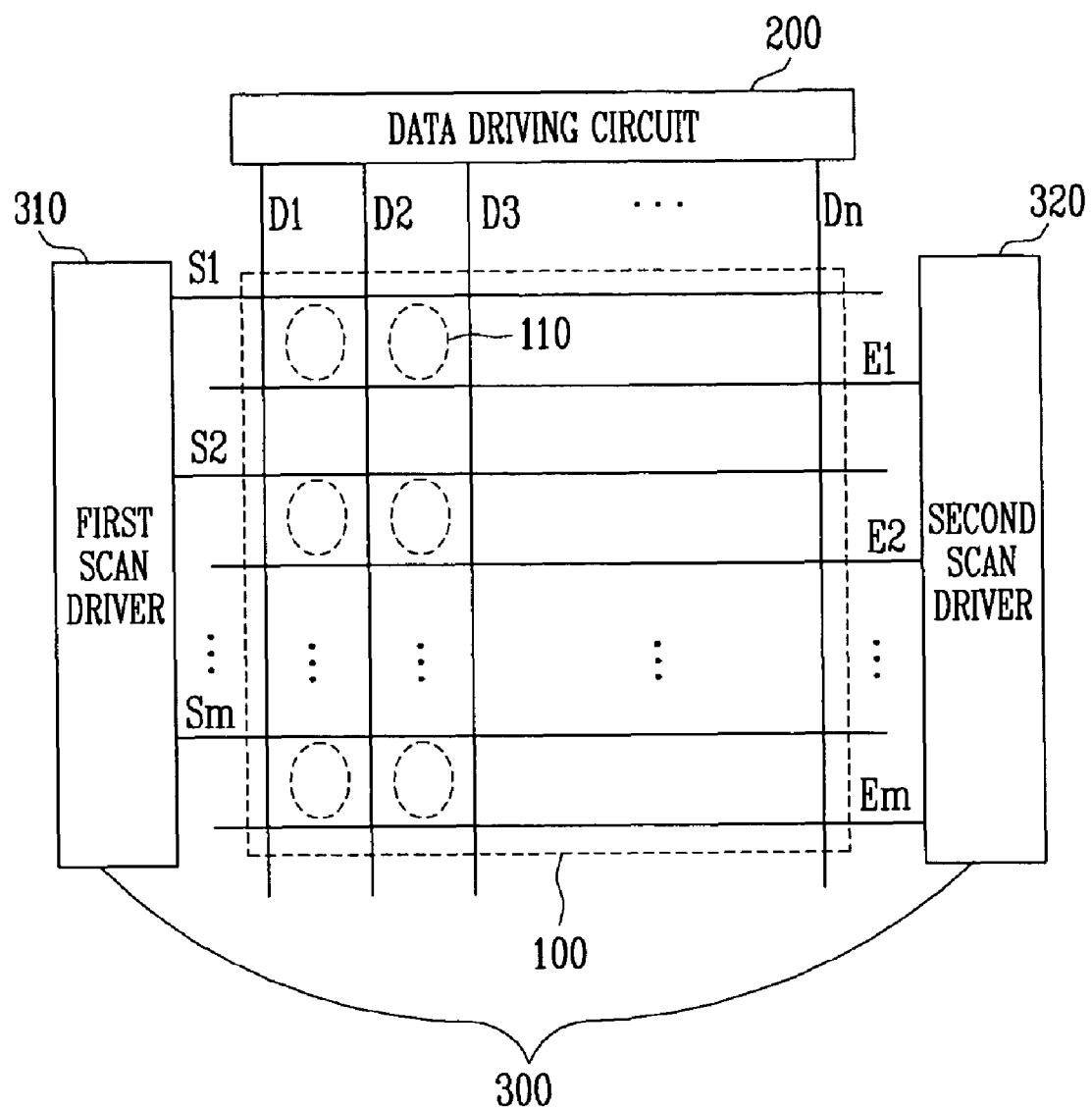
FIG. 4 is a block diagram showing an organic light emitting display according to one embodiment.

FIG. 4 is a block view showing an organic light emitting display according to one embodiment.

As shown in FIG. 4, the organic light emitting display according to one inventive embodiment includes an organic light emitting display panel (referred to as "display panel" hereinafter) 100, a data driving circuit 200, and a scan driving circuit. The scan driving circuit includes a first scan driver 310 and a second scan driver 320. The first scan driver 310 provides a selection signal. The second scan driver 320 provides an emission signal.

The display panel 100 includes a plurality of data lines D1 through Dn, a plurality of signal lines S1 to Sm and E1 to Em, and a plurality of pixel circuits 110. The plurality of data lines D1 through Dn are arranged in a row direction. The plurality of signal lines S1 to Sm and E1 to Em are arranged in a column direction. The plurality of pixel circuits 110 are arranged in a matrix pattern.

Here, the signal lines S1 to Sm and E1 to Em include a plurality of selection signal lines S1 to Sm for transferring a selection signal so as to select a pixel, and a plurality of emission signal lines E1 to Em for transferring an emission signal to control an emission period of an organic light emitting diode.

Further, pixel circuits 110 are formed at a pixel regions defined by the data lines D1 through Dn, the selection signal lines S1 to Sm, and the emission signal lines E1 to Em.

The data driving circuit 200 applies a data current $I_{DATA}$ to the data lines D1 through Dn. The first scan driver 310 of the scan driving circuit 300 sequentially applies a selecting signal for selecting a pixel circuit 110 to the selection signal lines S1 to Sm. Further, the second scan driver 320 applies an emission signal for controlling a luminance of the pixel circuit 110 to the emission signal lines E1 to Em.

Figure 5:
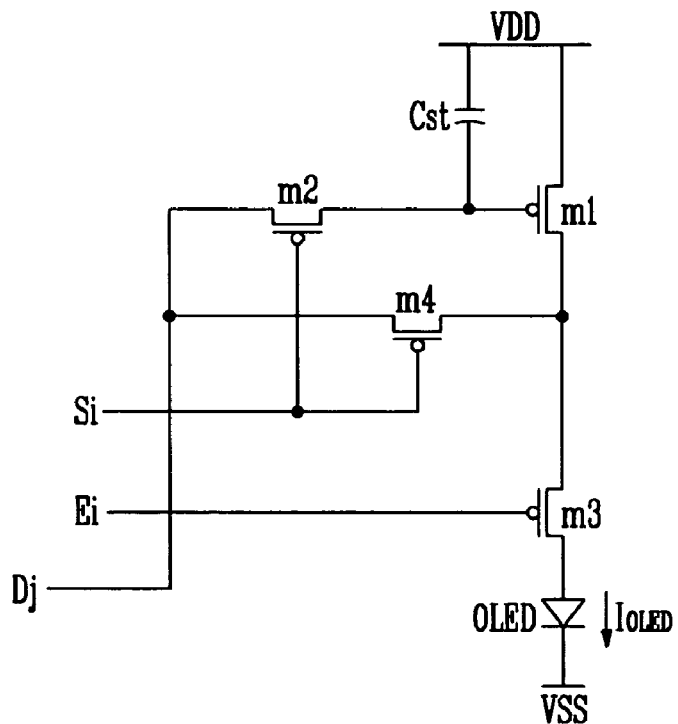
FIG. 5 is a circuit diagram showing an example of a pixel circuit arranged at each pixel region of the organic light emitting display shown in FIG. 4.

FIG. 5 is a circuit diagram showing an example of a pixel circuit shown in FIG. 4. However, in order to help understanding of the pixel circuit, only a pixel circuit connected to a j-th data line Dj and i-th signal lines Si and Ei is shown in FIG. 5.

As shown in FIG. 5, the pixel circuit according to one embodiment includes an organic light emitting diode OLED, transistors m1 to m4, and a capacitor Cst. Here, although PMOS transistors are used for each of the transistors m1 to m4, NMOS and CMOS implementations are also possible.

A first transistor m1 is coupled between a power supply VDD and an organic light emitting diode OLED, and controls an electric current through the organic light emitting diode OLED. In detail, a source of the first transistor m1 is coupled with the power supply VDD, and a drain thereof is coupled with a cathode of the organic light emitting diode OLED through a third transistor m3.

Furthermore, in response to a selection signal from the selection signal line Si, the second transistor m2 passes a voltage from the data line Dj to a gate of the first transistor m1. A fourth transistor m4 diode-connects the first transistor m1 in response to the selection signal.

Moreover, the capacitor Cst is coupled between a gate and a source of the first transistor m1, and is charged with a voltage corresponding to the gate voltage of the first transistor m1 sourcing the data current $I_{DATA}$ to the data line Dj. A third transistor m3 passes an electric current flowing through the first transistor m1 to the organic light emitting diode OLED in response to an emission signal from the emission signal line Ei.

Figure 6:
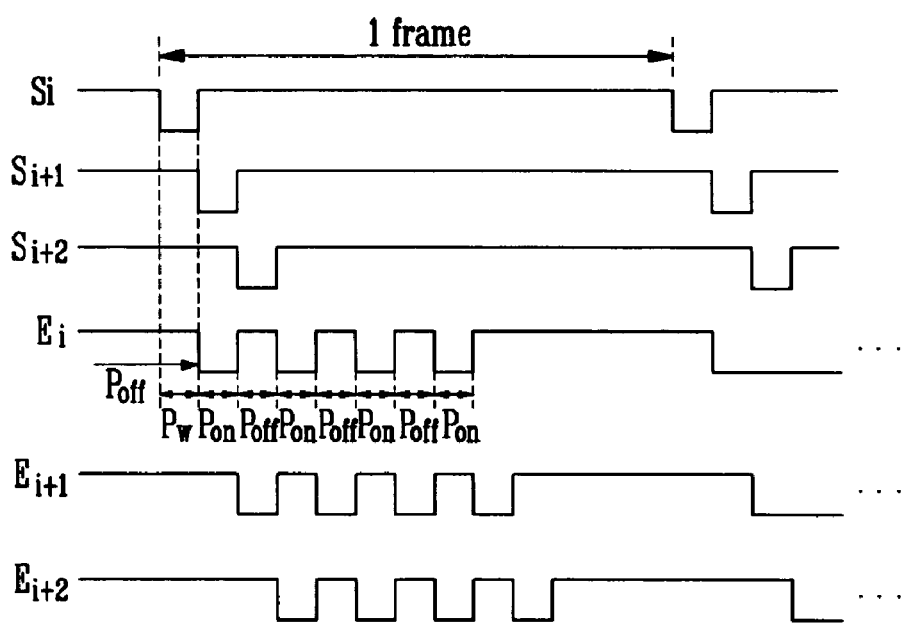
FIG. 6 is a waveform diagram of selection and emission signals that are supplied to the pixel circuit shown in FIG. 5.

FIG. 6 is a waveform diagram of selection and emission signals that are supplied to the pixel circuit shown in FIG. 5.

As shown in FIG. 6, a selection signal to turn-on the second transistor m2 and the fourth transistor m4 is sequentially applied to selection signal lines Si, Si+1, and Si+2. When the second transistor m2 and the fourth transistor m4 are turned on, the capacitor Cst is charged with a voltage corresponding to the gate voltage of the first transistor m1 in response to the first transistor m1 sourcing the data current $I_{DATA}$ to the data lines D1 to Dn while being diode connected by the second and fourth transistors m2 and m4. Accordingly, the capacitor Cst stores a voltage corresponding to the gate voltage of the first transistor m1 while sourcing the data current $I_{DATA}$.

After the charge is stored, the selection signal Si is removed and the emission signal Ei is applied. In response, the second and fourth transistors m2 and m4 are turn off, and the third transistor m3 is turns on. Because the first transistor m1 gate voltage is maintained by the capacitor Cst, a data current $I_{DATA}$ flows through the first and third transistors m1 and m3 to the OLED.

In some embodiments, the emission signal may be applied to the emission signal lines Ei, Ei+1, and Ei+2 during the rest of the frame time in such a way that the level is changed. For example, as shown in FIG. 6 a low level and a high level may be sequentially applied to the signal lines Ei, Ei+1, and Ei+2.

In this embodiment, when the emission signal applied to the emission signal lines Ei, Ei+1, and Ei+2 has a low level, the third transistor m3 is turned on, and thus an electric current sourced from the first transistor m1 is supplied to the organic light emitting diode OLED, with the result that the organic light emitting diode OLED emits light in response to the electric current. In contrast to this, when the emission signal is at a high level, the third transistor m3 is turned off, thus electric current applied from the first transistor m1 is not supplied to the organic light emitting diode OLED, with the result that the organic light emitting diode OLED does not emit light Accordingly, during a recording period Pw the emission signal line is high such that the third transistor m3 is off, and the selection signal Si is low such that the first transistor m1 is diode connected and the capacitor Cst is charged with a voltage corresponding to the data current $I_{DATA}$ from the data lines D1 to Dn.

Next, during an on period Pon, the emission signal line Ei is low such that the current sourced from the first transistor is applied to the OLED, which emits light in response to the applied current. Next, during an off period Poff, the emission signal line Ei is high such that the OLED receives substantially no current and is accordingly dark. As shown in FIG. 6 on periods Pon and off periods Poff may be sequentially alternated. In some embodiments, on periods Pon and off periods Poff may be of unequal durations. In some embodiments the alternating on periods Pon and off periods Poff may continue throughout the frame period. In such embodiments the portion of on time for the OLED may be regulated by control of the duty cycle of the emission signal Ei. For example a duty cycle on emission signal Ei of about 50% corresponds to the OLED being on about 50% of the frame period.

As seen from FIG. 4, the selection signal and the emission signal are provided to a panel through the first scan driver 310 and the second scan driver 320, respectively. Construction and operation of the scan driving circuit according to some embodiments will be explained. In these embodiments the selection signal and the emission signal have waveforms as shown in FIG. 6, but other waveforms and corresponding embodiments are also possible.

Figure 7:
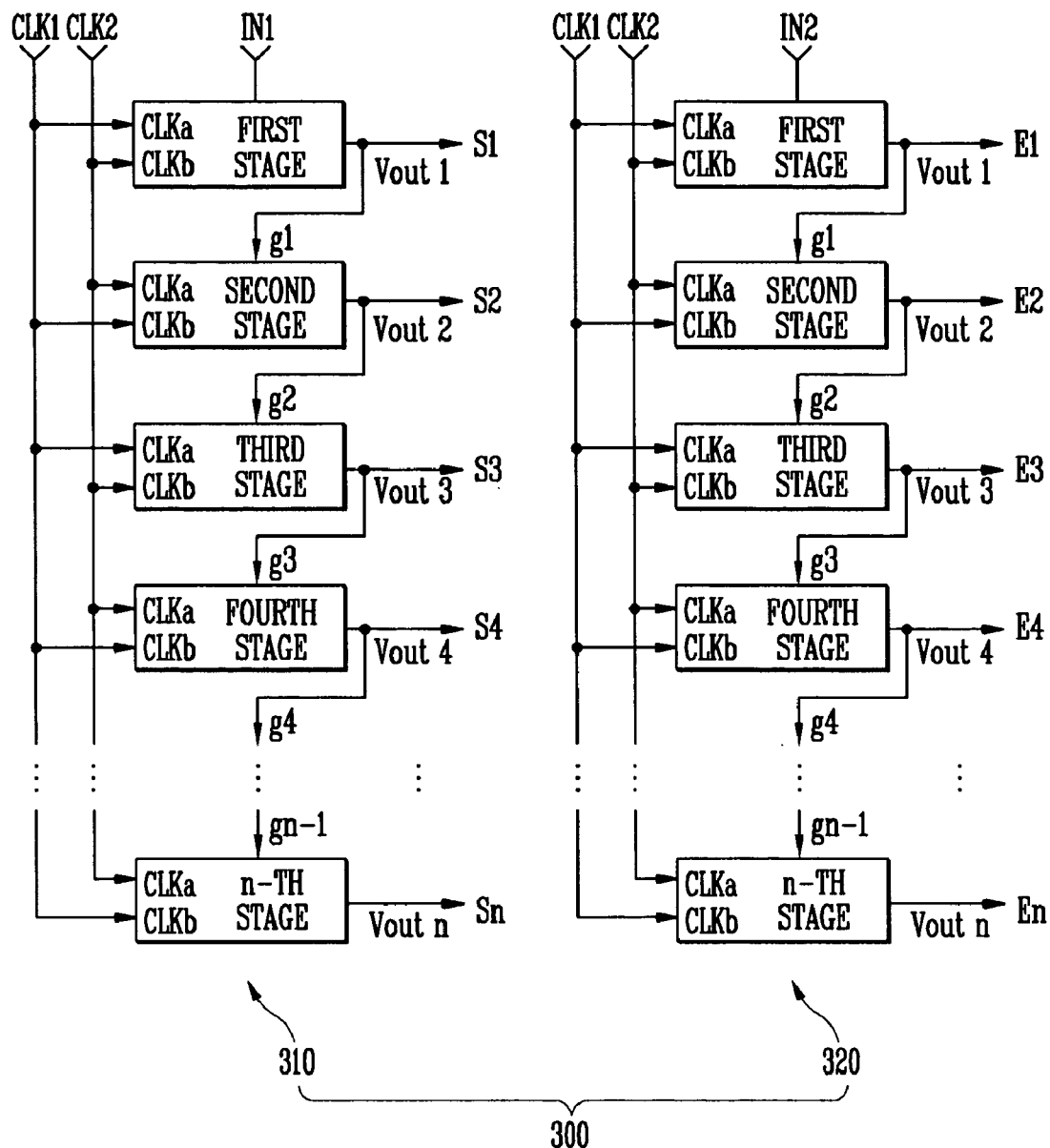
FIG. 7 is a block diagram showing a configuration of a scan driving circuit according to one embodiment.

FIG. 7 is a block diagram showing an embodiment of a scan driving circuit. As noted previously, the scan driving circuit 300 includes a first scan driver 310 and a second scan driver 320. The first scan driver 310 outputs a selection signal for driving a m by n pixel array. The second scan driver 320 outputs an emission signal. The first driver 310 includes first n stages that are coupled with a first input signal IN1 line. The second driver 320 includes second n stages that are coupled with a second input signal IN2 line.

First output lines of the first n stages are coupled with first n row lines S1 to Sn in the pixel array, and provide a selection signal to the pixel rows. Second output lines of the second n stages are coupled with second n row lines E1 to En in the pixel array, and provide an emission signal to the pixel rows.

Here, a first input signal IN1 is supplied to a first stage in the first scan driver 310, and a second input signal IN2 is supplied to a first stage in the second scan driver 320. Output signals of first to (n−1) th stages are supplied to respective next stages as input signals.

Further, each stage of the first scan driver 310 includes a first clock terminal CLKa and a second clock terminal CLKb. First and second opposite phase clock signals CLK1 and CLK2 are supplied to the first clock terminal CLKa and the second clock terminal CLKb. A first clock signal CLK1 is supplied to the first clock terminal CLKa of odd-numbered stages in the first scan driver 310, and a second clock signal CLK2 is supplied to the second clock terminal CLKb. In contrast to this, the second clock signal CLK2 is supplied to first clock terminal CLKa of even-numbered stages, and the first clock signal CLK1 is supplied to a second clock terminal CLKb of the even-numbered stages.

Each stage receives the first input signal IN1 or an output voltage gi of a previous stage, and the first and second clock signals CLK1 and CLK2. In response, each stage sequentially outputs a low-level signal through an output line.

Similarly, each stage of the second scan driver 320 includes a first clock terminal CLKa and a second clock terminal CLKb. First and second phase inverted clock signals CLK1 and CLK2 are supplied to the first clock terminal CLKa and the second clock terminal CLKb. The second clock signal CLK2 is supplied to the first clock terminal CLKa of odd-numbered stages in the second scan driver 320, and a first clock signal CLK1 is supplied to the second clock terminal CLKb. In contrast to this, the first clock signal CLK1 is supplied to a first clock terminal CLKa of even-numbered stages, and the second clock signal CLK2 is supplied to a second clock terminal CLKb of the even-numbered stages.

Each stage receives the first input signal IN2, or an output voltage gi of a previous stage, and the first and second clock signals CLK1 and CLK2. In response, each stage sequentially outputs an emission signal through an output line in such a way that the emission signal alternate between low and high levels.

Figure 8:
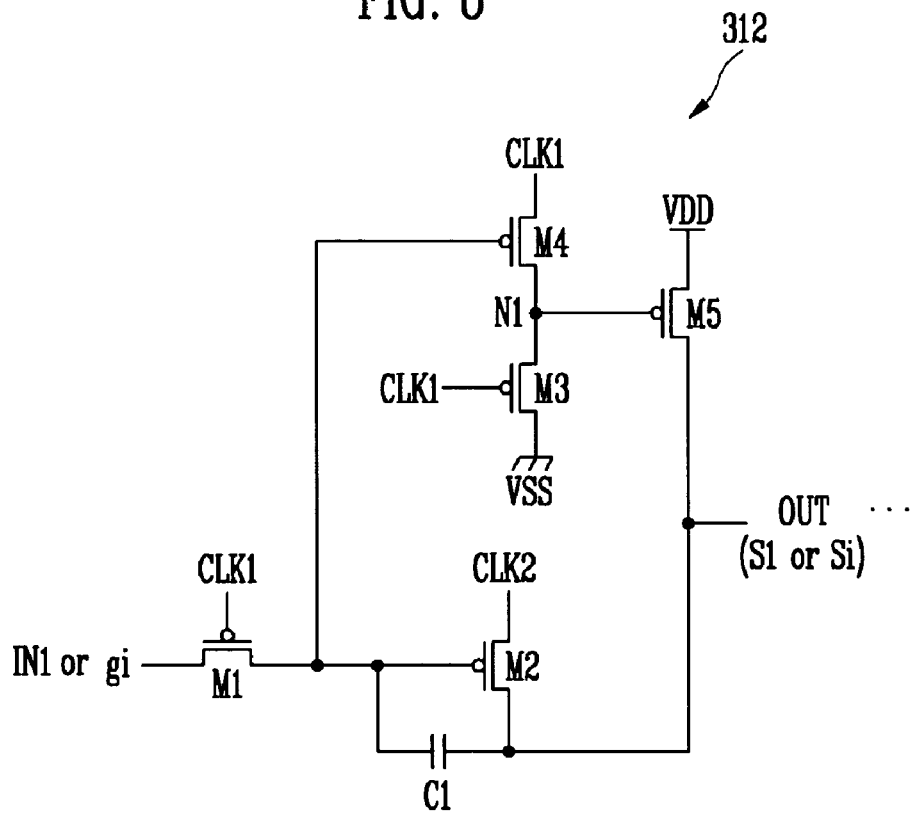
FIG. 8 is a circuit diagram of a stage in the scan driving circuit shown in FIG. 7.
Figure 8:
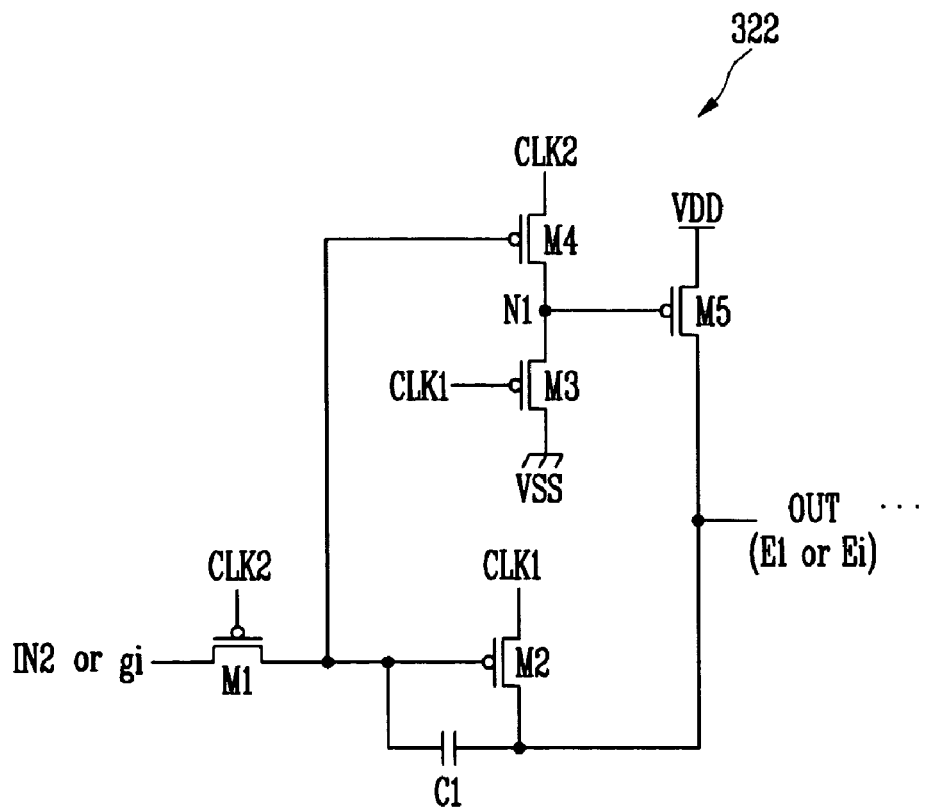
Figure 9:
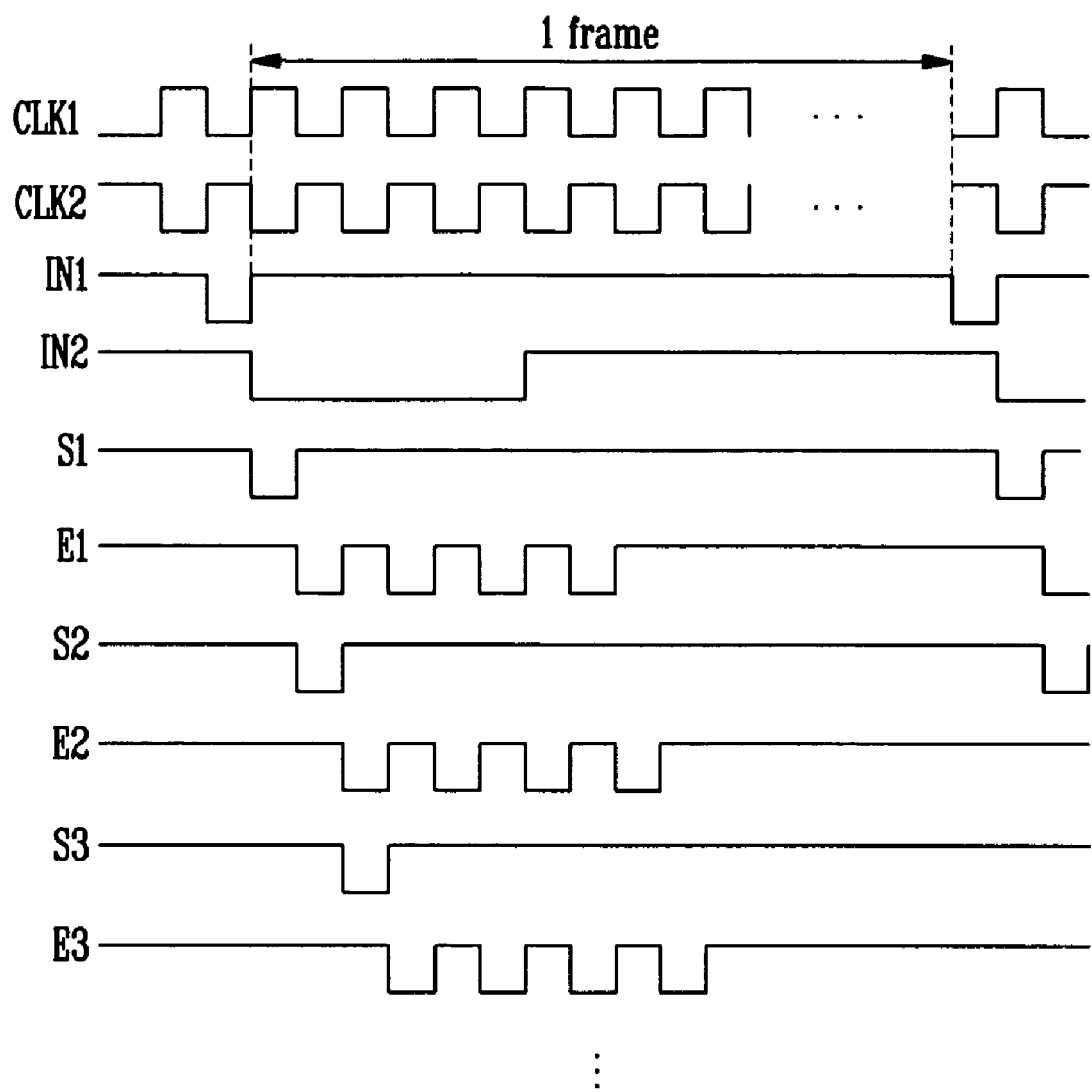
FIG. 9 is an input/output waveform diagram of the stage shown in FIG. 8.

FIG. 8 is a circuit diagram of a stage in the scan driving circuit shown in FIG. 7. FIG. 8 shows a detailed circuit arrangement of an odd-numbered stage 312 of the first scan driver, and a detailed circuit arrangement of an odd-numbered stage 322 of the second scan driver. FIG. 9 is an input/output waveform diagram of the stage shown in FIG. 8.

With reference to FIG. 8 and FIG. 9, one cycle of input clock signals CLK1 and CLK2 is divided into first and second time periods. Odd-numbered stages 312 and 322 of the first scan driver and the second scan driver each perform a precharge operation during the first time period. The odd-numbered stages 312 and 322 perform an evaluation operation during the second time period that causes a pulse of a low level to be shifted and output for a half period of the clock signal. The odd-numbered stages 312 and 322 each output a high-level signal during the precharge period, and output a signal corresponding to an input received during the evaluation period.

Moreover, by arranging the evaluation period of the odd-numbered stages so as to coincide with the precharge period of even-numbered stages, a low-level signal is transferred sequentially through all stages, where transfers occur at times corresponding to a half periods of the clock.

Hereinafter, operation of odd numbered stage 312 will be explained in detail by reference to a circuit arrangement of an odd-numbered stage shown in FIG. 8. Other stages including even numbered stages of the first scan driver, as well as the stages of the second scan driver have similar structure.

PMOS thin film transistors will be now described as an example of transistors included in the stages. However, an embodiment of the present invention is not limited thereto. For example, NMOS transistors may additionally or alternatively be used.

Referring to FIG. 8, the odd numbered stage 312 includes a first PMOS transistor M1, a second PMOS transistor M2, a third PMOS transistor M3, a fourth PMOS transistor M4, and a fifth PMOS transistor M5. The first PMOS transistor M1 receives an output voltage gi of a previous stage or a first input signal IN1. A gate terminal of the first PMOS transistor M1 is coupled with a first clock terminal CLK1. The second PMOS transistor M2 is coupled with a second clock terminal CLK2 and an output line OUT, and a gate terminal of the second PMOS transistor M2 is coupled with an output terminal of the first PMOS transistor M1. The third PMOS transistor M3 is coupled between a second power supply VSS and a first node N1, and has a gate terminal coupled with the first clock terminal CLK1. The fourth PMOS transistor M4 is coupled between the first clock terminal and the first node N1, and has a gate terminal coupled with an output terminal of the first PMOS transistor M1. The fifth PMOS transistor M5 is coupled between a first power supply VDD and the output line OUT, and has a gate terminal coupled with the first node N1. The odd numbered stage 312 further includes a first capacitor C1 that is coupled between an output terminal of the first PMOS transistor M1 and the output line OUT.

As shown, odd-numbered stage 312 of the first scan driver has a first clock signal CLK1 supplied to the first clock terminal, and a second clock signal CLK2 supplied to the second clock terminal. Odd numbered stage 322 of the second scan driver has the second clock signal CLK2 supplied to the first clock terminal, and the first clock signal CLK1 supplied to the second clock terminal.

In contrast to this, when the stage is an even numbered stage of the first scan driver, a first clock signal CLK1 is supplied to the second clock terminal, and a second clock signal CLK2 is supplied to the first clock terminal. Also, when the stage is an even numbered stage of the second scan driver, the first clock signal CLK1 is supplied to the first clock terminal, and the second clock signal CLK2 is supplied to the second clock terminal.

Furthermore, a negative supply voltage may be applied to the second power supply VSS. The second power supply VSS may be grounded as shown in FIG. 8.

Each stage includes a transfer unit, an inversion unit, and a buffer unit. In the embodiment of FIG. 8, the transfer unit is composed of a first PMOS transistor M1, a second PMOS transistor M2, and a first capacitor C1. The inversion unit is composed of first, third, and fourth PMOS transistors M1, M3, and M5.

Assuming that the stage is an odd-numbered stage 312 of the first scan driver, a time period when the first clock signal CLK1 has a low level and the second clock signal CLK2 has a high level becomes a precharge period. A time period when the first clock signal CLK1 has a high level and the second clock signal CLK2 has a low level becomes an evaluation period. The odd-numbered stage 312 of the first scan driver outputs a high-level signal during the precharge period, and during the evaluation period outputs a signal corresponding to an input received during the precharge period.

In contrast to this, assuming that the stage is an odd-numbered stage 322 of the second scan driver, a time period when the first clock signal CLK1 has a high level and the second clock signal CLK2 has a low level becomes a precharge period. A time period when the first clock signal CLK1 has a low level and the second clock signal CLK2 has a high level becomes an evaluation period. The odd-numbered stage 322 of the second scan driver outputs a high-level signal during the precharge period, and during the evaluation period outputs a signal corresponding an input received during the precharge period.

An operation of the odd-numbered stage 312 of the first scan driver will be explained with reference to FIG. 8 and FIG. 9. First, during the precharge period the first clock signal CLK1 of a low level and the second clock signal CLK2 of a high level are input. Accordingly, the first and third transistors M1 and M3 are turned on, whereby an input signal IN1 is passed to gate terminals of the second and fourth transistors M2 and M4.

Accordingly, since an output voltage of a previous stage or an input signal IN1 is stored in the first capacitor C1 as an input signal, and a first node N1 is charged with a first clock signal CLK1 or a low-level signal from the second power supply VSS, the fifth transistor M5 is turned-on, with the result that a first power supply VDD of a high level is output to an output terminal OUT. That is, during the precharge period, the output of the buffer unit of the stage is a high level.

Moreover, during the evaluation period, the first clock signal CLK1 of a high level and the second clock signal CLK2 of a low level are input. Accordingly, the first transistor M1 is turned off, thus blocking the input signal IN1 and the third transistor M3 is accordingly turned off.

During the evaluation period, the capacitor C1 maintains the level of the input signal charged during the precharge period. When the input voltage received during the precharge period is at a high level, the fourth transistor M4 remains off during the evaluation period, and the buffer unit continues to output a high-level signal.

In contrast to this, when the input voltage received during the precharge period is at a low level, the fourth transistor M4 is on during the evaluation period, and the node N1 is connected to the first clock signal CLK1. Additionally, the second transistor M2 is on, and the output OUT of the buffer unit is connected to the second clock signal CLK2.

In summary, during the evaluation period, when a signal received during the precharge period, namely, an output voltage of a previous stage or an input signal IN1 is at a low level, the stage outputs a highlevel signal. Similarly, when the signal received during the precharge period is at a high level, the stage outputs a high level signal during the evaluation period.

Accordingly, each stage of the first scan driver receives a first input signal IN1, or an output voltage gi of a previous stage, and first and second clock signals CLK1 and CLK2. According to those input signals, each stage performs a precharge operation during a first time period, and performs an evaluation operation during a second time period. As the stages are serially connected, a low-level pulse is shifted and output by each sequential stage for a half period of input clock CLK1 and CLK2. Consequently, a low-level signal is sequentially output through an output line of each stage. The output lines of the stages are therefore configured for use as a selection signal for the pixel rows of the array.

The odd-numbered stage 322 of the second scan driver shown in FIG. 8 and described by timing signals in FIG. 9 has the same circuit arrangement as that of the odd-numbered stage 312 of the first scan driver described above, and thus the detailed description thereof is omitted.

In the odd-numbered stage 322 of the second scan driver, a second clock signal CLK2 is supplied to a first clock terminal, and a first clock signal CLK1 is supplied to a second clock terminal. That is, signal/input correspondence is opposite that of the odd-numbered stage of the first scan driver.

Consequently, precharge periods and evaluation periods of the first and second scan drivers overlap. Namely, clock signals input to first and second clock terminals of even numbered stages of the first scan driver are identical with clock signals input to first and second clock terminals of odd numbered stages of the second scan driver. Similarly, clock signals input to first and second clock terminals of odd numbered stages of the first scan driver are identical to clock signals input to first and second clock terminals of even numbered stages of the second scan driver. Accordingly, when the odd-numbered stage of the first scan driver outputs a low-level signal, the odd-numbered stage of the second scan driver outputs a high-level signal.

Moreover, as shown in FIG. 9, a first input signal IN2 is supplied to the second scan driver during a time period corresponding to several periods of the clock signal, unlike a first input signal IN1 supplied to the first scan driver. In some embodiments, the time period has a constant duration for each data frame.

Consequently, in response to the first input signal IN2, and according to the operation described above, each stage of the second scan driver sequentially outputs a series of low-levels and high-levels The output signals of the stages are therefore configured for use as emission signals, to be provided to the pixel rows of a display array.

In some embodiments, the first input signal IN2 may be applied throughout the frame period. In such embodiments, the portion of on time for the OLED may be regulated by control of the duty cycle of the first and second clock signals CLK1 and CLK2, and consequently of the emission signal Ei. For example a duty cycle on emission signal Ei of about 50% corresponds to the OLED being turned on about 50% of the frame period.

As is made apparent from the above description, and in accordance with a scan driving circuit of these embodiments, a first scan driver providing a selection signal, and a second scan driver providing an emission signal cause the emission signal to be applied during a data frame period at least once so as to prevent the degradation of the pixels, which can occur when constant current is drawn by conventional pixels.

Furthermore, because the stage circuits have substantially no static current, the stage circuits have minimal power consumption. Similarly, when driving purely capacitive loads, such as a pixel row, there is substantially no static output current, and power consumption is accordingly minimized. Consequently, for large capacitive loads, operation speed can be optimized without significant increase in power consumption.

Although a few embodiments of the present invention have been shown and described, it would be appreciated by those skilled in the art that changes might be made in this embodiment without departing from the principles and spirit of the invention.

What is claimed is:

1. A scan driving circuit comprising:
    a first scan driver comprising a plurality of first stages and configured to sequentially output a selection signal; and
    a second scan driver comprising a plurality of second stages and configured to sequentially output an emission signal,
    wherein each of the first and second stages comprises:
    a first transistor configured to receive an output voltage of a previous stage or a first input signal, and comprising:
        a gate terminal coupled to a first clock terminal; and
        an output terminal;
    a second transistor coupled with a second clock terminal and an output line, and comprising a gate terminal coupled to the output terminal of the first transistor;
    a third transistor coupled between a second power supply and a first node, comprising a gate terminal coupled to one of the first and second clock terminals;
    a fourth transistor coupled with the first clock terminal and the first node, and comprising a gate terminal coupled to the output terminal of the first transistor;
    a fifth transistor coupled between a first power supply and the output line, and comprising a gate terminal coupled to the first node; and
    first and second clock input lines configured to receive first and second clock signals, respectively, wherein the first clock input line is coupled to the first clock terminal of a plurality odd numbered stages of the first scan driver, and the second clock input line is coupled to the second clock terminal of the plurality of odd numbered stages of the first scan driver,
    wherein each of the plurality of odd numbered stages of the first scan driver is configured to perform a precharge operation when the first clock signal has a low level, and to perform an evaluation operation when the first clock signal has a high level.

2. The scan driving circuit as claimed in claim 1, further comprising a first capacitor coupled between the output terminal of the first transistor and the output line.

3. The scan driving circuit as claimed in claim 1, wherein each of the first and second stages are configured to receive a signal at the first clock terminal and a signal at the second clock terminal having phases substantially inverted with respect to one another.

4. The scan driving circuit as claimed in claim 1, wherein performing the precharge operation comprises outputting a high level output and receiving an input signal, and performing the evaluation operation comprises outputting a level corresponding to the input signal, wherein the plurality of first stages are collectively configured to sequentially generate a series of selection signals, and wherein the selection signals are generated substantially once every half period of at least one of the first and second clock signals.

5. The scan driving circuit as claimed in claim 1, further comprising first and second clock input lines configured to receive first and second clock signals, respectively, wherein the second clock input line is coupled to the first clock terminal of a plurality odd numbered stages of the second scan driver, and the first clock input line is coupled to the second clock terminal of the plurality of odd numbered stages of the second scan driver.

6. The scan driving circuit as claimed in claim 5, wherein each of the plurality of odd numbered stages of the second scan driver is configured to perform a precharge operation when the second clock signal has a low level, and to perform an evaluation operation when the second clock signal has a high level.

7. The scan driving circuit as claimed in claim 6, wherein performing the precharge operation comprises outputting a high level output and receiving an input signal, and performing the evaluation operation comprises outputting a level corresponding to the input signal, wherein the plurality of second stages are collectively configured to sequentially generate a series of emission signals, wherein the emission signals are generated substantially once every half period of at least one of the first and second clock signals.

8. The scan driving circuit as claimed in claim 1, wherein each of the clock signals input to each of the first and second clock terminals of an odd numbered stage of the first scan driver are substantially identical to each of the clock signals input to each of the first and second clock terminals of an even-numbered stage of the second scan driver.

9. The scan driving circuit as claimed in claim 1, wherein each of the clock signals input to each of the first and second clock terminals of an even numbered stage of the first scan driver are substantially identical to each of the clock signals input to each of the first and second clock terminals of an odd numbered stage of the second scan driver.

10. The scan driving circuit as claimed in claim 1, further comprising first and second clock input lines configured to receive first and second clock signals, respectively, wherein the plurality of stages of the second scan driver is configured to receive an input signal of a duration substantially equal to an integral number of periods of at least one of the first and second clock signals.

11. The scan driving circuit as claimed in claim 10, wherein the duration is substantially constant during different data frame periods.

12. The scan driving circuit as claimed in claim 10, wherein each stage of the second scan driver is configured to output a series of alternating high and low levels in response to the input signal.

13. A scan driving circuit comprising:
first and second clock signal input lines configured to, respectively, receive first and second clock signals;
a first scan driver configured to output a selection signal, the first scan driver comprising a plurality of first stages;
a second scan driver configured to output an emission signal, the second scan driver comprising a plurality of second stages, wherein each of the first and second stages comprises an input terminal and first and second clock terminals, and is coupled to an input line at the input terminal or an output line of a previous stage so as to receive an input signal at the input terminal, and is coupled to the first and second clock signal input lines so as to receive the first and second clock signals at the first and second clock terminals,
wherein each stage is configured to perform a precharge operation outputting a high-level signal and receiving the input signal, wherein the precharge operation is performed during a first portion of a period of at least one of the first clock signal and the second clock signal, and to output a level corresponding to the level of the input signal, wherein the plurality of first stages are collectively configured to sequentially generate a series of low level pulses, and wherein the low level pulses are generated substantially once every half period of at least one of the first and second clock signals.

14. The scan driving circuit as claimed in claim 13, wherein each of the stages includes:
a first transistor configured to receive an output voltage of a previous stage or a first input signal, and comprising a gate terminal coupled to the first clock terminal and an output terminal;
a second transistor coupled to the second clock terminal and an output line, and comprising a gate terminal coupled to the output terminal of the first transistor;
a third transistor coupled between a second power supply and a first node, comprising a gate terminal coupled to one of the first and second clock terminals;
a fourth transistor coupled to the first clock terminal and the first node, and comprising a gate terminal coupled to the output terminal of the first transistor; and
a fifth transistor coupled between a first power supply and the output line, and comprising a gate terminal coupled to the first node.

15. The scan driving circuit as claimed in claim 14, further comprising a first capacitor coupled between the output terminal of the first transistor and the output line.

16. The scan driving circuit as claimed in claim 13, wherein each of the first and second stages are configured to receive first and second clock signals having phases substantially inverted with respect to one another.

17. The scan driving circuit as claimed in claim 13, wherein the first clock input line is coupled to the first clock terminal of a plurality odd numbered stages of the first scan driver, and the second clock input line is coupled to the second clock terminal of the plurality of odd numbered stages of the first scan driver.

18. The scan driving circuit as claimed in claim 17, wherein each of the plurality of odd numbered stages of the first scan driver is configured to perform a precharge operation when the first clock signal has a low level, and to perform an evaluation operation when the first clock signal has a high level.

19. The scan driving circuit as claimed in claim 18, wherein performing the precharge operation comprises outputting a high level output, and performing the evaluation operation comprises outputting a level corresponding to the input signal received while performing the precharge operation, wherein the plurality of second stages are collectively configured to sequentially generate a series of selection signals, and wherein the selection signals are generated substantially once every half period of at least one of the first and second clock signals.

20. The scan driving circuit as claimed in claim 13, wherein the second clock input line is coupled with the first clock terminal of a plurality odd numbered stages of the second scan driver, and the first clock input line is coupled with the second clock terminal of the plurality of odd numbered stages of the second scan driver.

21. The scan driving circuit as claimed in claim 20, wherein each of the plurality of odd numbered stages of the second scan driver is configured to perform a precharge operation when the second clock signal has a low level, and to perform an evaluation operation when the second clock signal has a high level.

22. The scan driving circuit as claimed in claim 21, wherein performing the precharge operation comprises outputting a high level output, and performing the evaluation operation comprises outputting a level corresponding to an input received while performing the precharge operation, wherein the plurality of second stages are collectively configured to sequentially generate a series of emission signals, wherein the emission signals are generated substantially once every half period of at least one of the first and second clock signals.

23. The scan driving circuit as claimed in claim 13, wherein each of the clock signals input to each of the first and second clock terminals of an odd numbered stage of the first scan driver are substantially identical to each of the clock signals input to each of the first and second clock terminals of an even numbered stage of the second scan driver.

24. The scan driving circuit as claimed in claim 13, wherein each of the clock signals input to each of the first and second clock terminals of an even numbered stage of the first scan driver are substantially identical to each of the clock signals input to each of the first and second clock terminals of an odd numbered stage of the second scan driver.

25. The scan driving circuit as claimed in claim 13, wherein the plurality of stages of the second scan driver is configured to receive an input signal of a duration substantially equal to an integral number of periods of at least one of the first and second clock signals.

26. The scan driving circuit as claimed in claim 25, wherein the duration is substantially constant during different data frame periods.

27. The scan driving circuit as claimed in claim 25, wherein each stage of the second scan driver is configured to output a series of alternating high and low levels in response to the input signal.

28. An organic light emitting display comprising:
a pixel array coupled to selection signal lines, data lines, and light emitting signal lines;
a data driving circuit configured to supply a data signal to the data lines; and
a scan driving circuit comprising:
first and second clock signal input lines configured to receive first and second clock signals;
a first scan driver configured to output a selection signal, the first scan driver comprising a plurality of first stages;
a second scan driver configured to output an emission signal, the second scan driver comprising a plurality of second stages,
wherein each of the first and second stages comprises an input terminal and first and second clock terminals, and is coupled to an input line at the input terminal or an output line of a previous stage so as to receive an input signal at the input terminal, and is coupled to the first and second clock signal input lines so as to receive the first and second clock signals at the first and second clock terminals, wherein each stage is configured to perform a precharge operation outputting a high-level signal and receiving the input signal, wherein the precharge operation is performed during a first portion of a period of at least one of the first clock signal and the second clock signal, and to output a level having a level corresponding to the input signal, wherein the plurality of first stages are collectively configured to sequentially generate a series of low level pulses, wherein the low level pulses are generated substantially once every half period of at least one of the first and second clock signals.

* * * * *